United States Patent [19]

Ledieu et al.

[11] Patent Number: 5,770,238
[45] Date of Patent: Jun. 23, 1998

[54] MASTER DISK FOR MAKING DIES FOR PRESSING IN PARTICULAR OPTICAL DISKS

[75] Inventors: Jean Ledieu, Crespieres; Jean-Francois Dufresne, Caen, both of France

[73] Assignee: Digipress, Caen, France

[21] Appl. No.: 626,387

[22] Filed: Apr. 2, 1996

Related U.S. Application Data

[63] Continuation of Ser. No. 190,772, Feb. 1, 1994, abandoned.

[30] Foreign Application Priority Data

Feb. 3, 1993 [FR] France ................................ 93 01177

[51] Int. Cl.$^6$ .................................................. B29C 33/42
[52] U.S. Cl. ...................... 425/175; 264/1.33; 264/1.37; 425/810
[58] Field of Search ................................. 264/1.33, 1.37, 264/2.7, 2.51, 106, 107; 425/810, 175, 177

[56] References Cited

U.S. PATENT DOCUMENTS

| | | | |
|---|---|---|---|
| 4,408,319 | 10/1983 | Tsunoda et al. | 264/106 |
| 4,430,401 | 2/1984 | Wilkinson | 264/1.33 |
| 4,482,511 | 11/1984 | Komatsubara | 264/1.33 |
| 4,610,933 | 9/1986 | Van de Leest. | |
| 4,953,385 | 9/1990 | Aoki et al. | 264/107 |
| 4,954,065 | 9/1990 | Shindo et al. | 425/810 |
| 5,338,178 | 8/1994 | Kato et al. | 264/106 |

FOREIGN PATENT DOCUMENTS

| | | |
|---|---|---|
| 0447711 | 9/1991 | European Pat. Off. . |
| 0488239 | 6/1992 | European Pat. Off. . |
| 2542900 | 9/1984 | France . |
| 2671657 | 6/1991 | France . |

OTHER PUBLICATIONS

Patent Abstracts of Japan—vol. 12, No. 361 (P. 763) Sep. 28, 1988.

Patent Abstracts of Japan—vol. 12, No. 144 (P. 697) May 6, 1988.

Patent Abstracts of Japan, JP–A–1 142 077 (Derwent Abstract), Jun., 1989.

Patent Abstracts of Japan, JP–A–2 172 041 (E.P.O. Abstract), Jul. 1990.

*Primary Examiner*—Mathieu D. Vargot
*Attorney, Agent, or Firm*—Steinberg, Raskin & Davidson, P.C.

[57] ABSTRACT

Master disks for providing dies in particular for pressing optical disks, methods of manufacturing same, pressing dies obtained from such master disks and optical disks obtained from the latter and such pressing dies, the master disks consisting of a support carrying at its surface a succession of microcups representative of the information to be duplicated and consisting of a hard, conducting material reflecting in the near infrared range and selected from a zirconium, hafnium or titanium nitride or carbonitride, a hard ceramic reflecting in the near infrared range and conducting at the surface only and a hard glass reflecting in the near infrared range and conducting at the surface only.

17 Claims, 2 Drawing Sheets

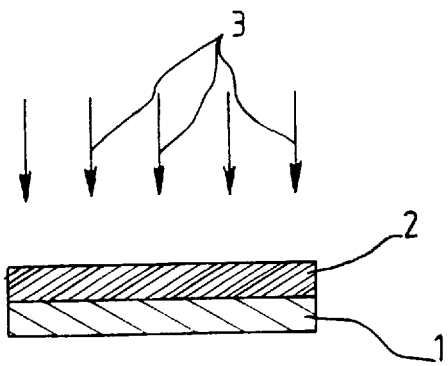
FIG. 3a
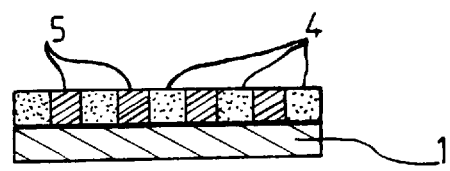
FIG. 3b
FIG. 3c
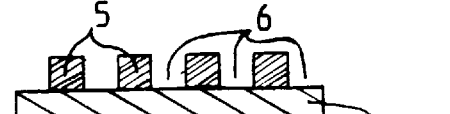
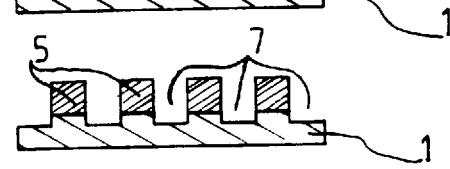
FIG. 3d
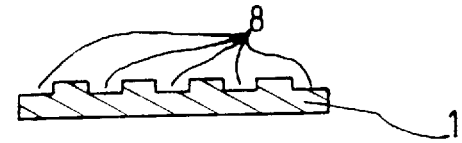
FIG. 3e
FIG. 3f
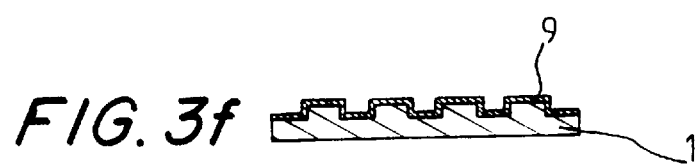
FIG. 3g

MASTER DISK FOR MAKING DIES FOR PRESSING IN PARTICULAR OPTICAL DISKS

This is a continuation, of U.S. Patent Application Ser. No. 08/190,772, filed Feb. 1, 1994 now abandoned.

BACKGROUND OF THE INVENTION

The invention relates to master disks for making dies for pressing in particular optical disks. It also relates to methods for the manufacture of these master disks as well as to the pressing dies obtained from these master disks and to the optical disks obtained from these pressing dies and from these master disks.

There are known many methods of manufacture of pressing dies for making optical disks. One of them consists in depositing upon a glass support or backing a photosensitive resin layer of positive type, i.e. capable under the effect of a suitable directing radiation of changing its nature in the zones receiving this radiation. This resin layer is subjected to the moving past or travel of a laser beam which inscribes or writes into the latter a latent image representing the information or data to be recorded on the disk. The resin is chemically developed by removing through the dissolving those zones where the resin has been recorded and thus providing a succession of microcups or micropits corresponding to the reproduced signal.

The whole unit thus made constitutes a master disk.

This master disk is then coated or lined with a fine metal in particular silver layer preferably deposited through evaporation under vacuum. By means of galvanoplasty or electroplating is then deposited a nickel layer upon the master disk coated with the fine metal layer. The nickel layer thus formed exhibits at its surface microreliefs or microrises which are the exact replica of the microcups or micropits previously cited, the microreliefs or microrises representing in negative fashion the information or data recorded on the master disk. After separation of the nickel layer from the master disk, the fine metal layer no longer exists upon the separation. There is thus obtained a printing die made from nickel which will allow the desired disks for optical read-out to be made by pressing a suitable plastics material, in particular polycarbonate. After the separation of the die from the master disk thus obtained, the latter is destroyed.

Moreover this master disk is not readable in a reader of optical disks.

OBJECT AND SUMMARY OF THE INVENTION

The object of the present invention is to cope with the foregoing inconveniences by providing master disks readable by a reader of optical disks and which may be used as many times as necessary for making new dies and this without any subsequent treatment or process. For that purpose, the invention provides a master disk allowing the making of a pressing die of the type consisting of a support or backing carrying at its surface a succession or series of microcups or micropits representative of the information or data to be duplicated and made from a hard material which is reflecting in the near infrared range and conducting and selected from a zirconium, hafnium or titanium nitride or carbonitride, a hard ceramic, reflecting in the near infrared range and conducting at the surface only and a hard glass reflecting in the near infrared range and conducting at the surface only.

According to a characterizing feature of this master disk, the support or backing is made from aluminum.

According to another characterizing feature of the master disk of the invention, the support or backing is made from tempered or toughened and/or de-alkalinized glass.

According to a particular embodiment of the invention, the succession of microcups or micropits representative of the information consists of the hard and conducting material reflecting in the near infrared range at the surface only.

According to another particular embodiment of the invention, the support or backing of the master disk consists of the same material as the succession of microcups.

According to a pecularity of the master disks of the invention, the hard and conducting material reflecting in the near infrared range is titanium nitride.

According to other particular aspects of the master disks of the invention, the depth of the microcups lies between about 500 and about 2,000 Å, the total or aggregate thickness of the master disk lies between about 1 and about 5 mm and the master disk has a diameter lying between about 150 mm and about 200 mm.

The invention also provides methods of manufacture of such master disks.

One method according to the invention consists in depositing upon a substrate a layer of hard, conducting material reflecting in the near infrared range.

According to a characterizing feature of this method, the hard, conducting material reflecting in the near infrared range is selected from a zirconium,. hafnium or titanium nitride or carbonitride, a hard ceramic reflecting in the near infrared range and conducting at the surface only and a hard glass reflecting in the near infrared range and conducting at the surface only ; depositing upon this layer of hard and conducting material reflecting in the near infrared range a layer of photosensitive resin; recording the information or data to be duplicated as a latent image into the layer of photosensitive resin by having a light beam modulated in accordance with the signal to be duplicated moving past or travelling along ; removing the insolated zones of resin, this removal leading to the creation of a succession of microcups ; transferring the information into the layer of hard and conductive material reflecting in the near infrared range and removing the zones of residual resin.

In this case the thickness of the hard and conducting material reflecting in the near infrared range is at least of 1,500 Å.

According to an alternative of the method of manufacture of the master disk of the invention, when the substrate consists of the same hard and conductive material reflecting in the near infrared range as the microcups, the step of depositing of the layer of hard and conductive material reflecting in the near infrared range is omitted and the information is transferred into this substrate.

When the microcups consist at the surface only of the hard and conducting material reflecting in the near infrared range, the method of manufacture of such a master disk consists in depositing upon a substrate a layer of photosensitive resin, recording the information to be duplicated into this layer of photosensitive resin by having a light beam modulated in accordance with the information to be duplicated moving past or travelling, removing the insolated resin zones, transferring the information into the substrate and then removing the residual resin zones and at last depositing a layer of hard and conductive material reflecting in the near infrared range.

According a particular aspect of the methods of manufacture of the master disks of the invention, the light beam is a laser beam, the removal of the photosensitive substance is carried out by a chemical attack or by attack with an oxygen plasma and the transfer of the recorded information is performed by a process of chemical engraving or by a process of engraving with a reactive plasma.

The pressing dies obtained from these master disks are also comprised within the scope of the invention as well as the disks for optical reading obtained from these pressing dies or from these master disks.

BRIEF DESCRIPTION OF THE DRAWINGS

The invention will be better understood and further objects, characterizing features, details and advantages thereof will appear more clearly as the following explanatory description proceeds with reference to the accompanying diagrammatic drawings given by way of non limiting examples only illustrating several presently preferred specific embodiments of the invention and in which:

FIGS. 3(a)–(g) diagrammatically illustrate a third embodiment of the manufacture of the invention.

DETAILED DESCRIPTION OF THE INVENTION

In all cases the master disks according to the invention consist of a support or backing comprising at its surface a succession of microcups or micropits representative of the information to be duplicated constituted at least at the surface of a hard and conductive material 9 reflecting in the near infrared range.

This material 9 should be very hard and should not be easily scratchable so that it may be easily manipulated or handled and have a long operating life from the mechanical standpoint in order to permit the manufacture of many dies without these repeated manufactures modifying or altering the shape of the microcups or their depth. It should have a very good adherence onto the substrate in particular onto glass and still more particularly onto aluminum so as to remove any risk of being torn away during the subsequent step of galvanoplasty or electroplating which will lead to the obtainment of the pressing die. It should be conductive to permit the step of galvanosplasty. It should also be stable chemically so as to be resistant in chemical baths and to have a long operating life in difficult environments and at last it should be reflecting in the range of the wavelengths used by readers of optical disks, i.e. in the near infrared range and more specifically at wavelengths of about 780 nm.

In this respect, the material 9 should be selected from a zirconium, hafnium or titanium nitride or carbonitride or a hard and conductive ceramic reflecting in the near infrared range.

The master disks according to the invention exhibit many advantages over the master disks known heretofore. At first they will permit the manufacture of many pressing dies without any risk of being damaged and of modification of the information they contain and without any previous treatment. Then it is not necessary to subject them to a special preparation prior to performing the step of manufacturing the die by galvanoplasty. At last the information they contain could be read out directly in a reader of optical disks. All these combined properties will allow it to be used in addition for the purpose of long lasting archiving or filing of information.

To make the subject matter of the invention better understandable, several embodiments will now be described by way of purely illustrative and non limiting examples.

EXAMPLE 1

Figure 1A:
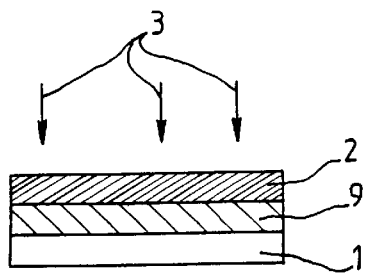
FIGS. 1(a)–(f) diagrammatically illustrate a first embodiment of the manufacture of the master disk according to the invention FIGS. 2(a)–(f) diagrammatically show a second embodiment of the manufacture of the master disks according to the invention.
Figure 1B:
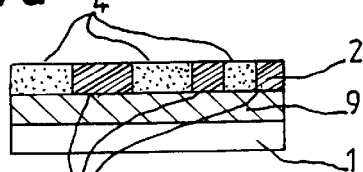
Figure 1C:
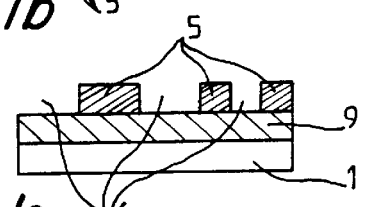
Figure 1D:
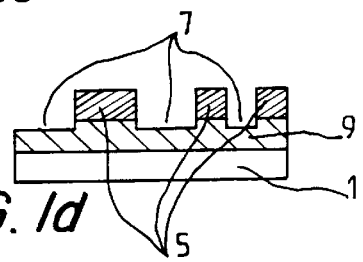
Figure 1E:
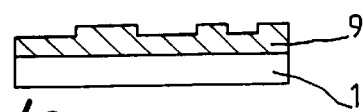
Figure 1F:
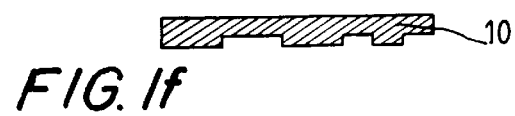

Referring to FIG. 1, the first step noted (a) of this preferred embodiment of the invention consists in depositing upon a substrate 1 made from de-alkalinized and/or tempered or toughened glass, a layer of the hard and conductive material 9 reflecting in the near infrared range, preferably of titanium nitride. The thickness of this layer of material 9 should be greater than the depth of the microcups to be formed. The depth of these microcups should lie between about 500 and about 2,000 Å with a view to be readable in present-day readers of optical disks. This depth should preferably be 1,500 Å.

The final thickness of the master disk obtained should lie between about 1 and about 5 mm, preferably between about 1 and about 3 mm to be readable in the readers of optical disks, thereby meaning that the thickness of the support 1 should lie between about 1 and about 5 mm, preferably between about 1 and about 3 mm and still to permit the reading of the master disk finally obtained in the existing readers of optical disks and to allow the use of a simple galvanoplasty process for making the die from this master disk, the diameter of this substrate 1 should lie between about 150 mm and about 200 mm. The layer of material 9 is then covered with a layer 2 of photosensitive resin and the information to be duplicated is recorded into this layer 2 of photosensitive resin as a latent image created by having a light beam 3 modulated in accordance with the signal to be encoded, moving past or travelling along, this light beam 3 preferably being a laser beam.

After that recording as illustrated in the step noted (b) on FIG. 1, the layer 2 of photosensitive resin then comprises insolated zones 4 of photosensitive resin and non insolated zones 5 of photosensitive resin.

During the step (c), the insolated zones 4 of resin are removed through chemical dissolution or by any other suitable process. There has thus been provided microcups 6 in the layer 2 of photosensitive resin, representative of the information to be duplicated.

During the next step noted (d), the information to be duplicated is transferred into those zones 7 of the layer of material 9 which are no longer covered with the photosensitive resin by a chemical engraving process or by a process of engraving with a reactive plasma.

At last, the non insolated and residual zones 5 of photosensitive resin are removed preferably by means of an oxygen plasma and there is obtained the desired master disk illustrated at (e) and consisting of the substrate 1 covered with microcups made from the material 9, preferably from titanium nitride.

The master disk thus obtained allows the manufacture of the pressing die 10 shown at (f) by a subsequent galvanoplasty step without the necessity of any specific preparation.

After this step of galvanoplasty, the master disk could be re-used many times for the future manufacture of new dies, it could be read out in conventional disk readers and therefore be tested in adapted compact disks readers and it could serve as an information archive or storage.

An additional advantage of this embodiment is that it will be possible to prepare in advance the substrate 1 covered with the layer of hard and conductive material 9 reflecting in the near infrared range, thereby permitting to have the step of depositing the layer of material 9 not integrated into the method of manufacture of the master disk and of the die.

EXAMPLE 2

In this example, the master disk is made as in the example 1 except that the substrate 1 is made from aluminum. Aluminum offers the advantage over the glass to be less brittle while permitting as in the case of glass to obtain a state of surface compatible with the manufacture of master disks, of pressing dies and of optical disks, i.e. a surface which has no rugosity greater than 50 Å.

Another advantage of the use of an aluminum substrate 1 is an advantage of economical character, aluminum being a less expensive material than glass. Of course, as in the example 1, it will be possible to prepare in advance the aluminum substrate 1 covered with a layer of titanium nitride, thereby also permitting to have this step of depositing not integrated into the method of manufacture of the master disk and of the pressing die.

Thus the master disk obtained according to the embodiment of example 1 and consisting of an aluminum substrate 1 covered with a succession of microcups representative of the information to be duplicated, consisting of titanium nitride, is the most preferred embodiment of the invention.

EXAMPLE 3

Figure 2A:
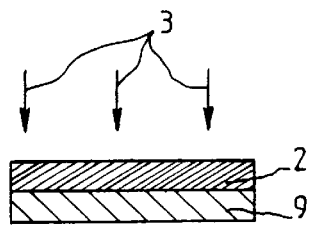
Figure 2B:
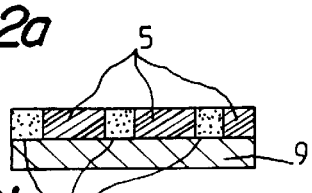
Figure 2C:
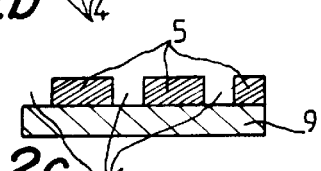
Figure 2D:
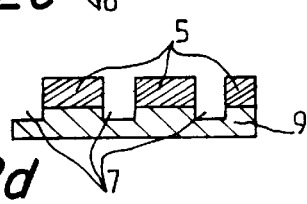
Figure 2E:
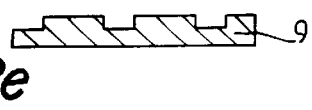
Figure 2F:
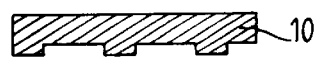

Referring now to FIG. 2, there will be described an exemplifying method of manufacture of a master disk according to the invention, wherein the microcups representative of the information and the substrate are made from the same hard and conductive material 9 reflecting in the near infrared range. As illustrated at the step noted (a) in FIG. 2, the first step of this method consists in depositing upon the substrate made from the material 9, a layer 2 of photosensitive resin into which the information to be duplicated is recorded by having a laser beam 3 modulated in accordance with the signal to be encoded, moving or travelling past.

The dimensions of the substrate made from the material 9 should be the same as those cited in the example 1.

As illustrated on the step noted (b) on FIG. 2, the support or backing made from the material 9 then comprises insolated zones 4 of photosensitive resin and non-insolated zones 5 of photosensitive resin.

The step noted (c) in FIG. 2 is a step of removal through chemical dissolution or by any other suitable process, of the insolated zones 4 of resin, thereby resulting in the creation of microcups 6 in the layer 2 of photosensitive resin.

At the step noted (d) in FIG. 2, there is performed the transfer of the information recorded into those zones 7 of the support made from the material 9 which are no longer covered with the photosensitive resin, by a chemical engraving process or by a method of engraving with a reactive plasma.

The zones 5 of residual resin are then removed by an oxygen plasma and there is then obtained the desired master disk shown at the step noted (e) in FIG. 2 and consisting of a support 1 comprising at its surface a succession of microcups the depth of which corresponds to the depth of the engraving previously carried out, the substrate and the microcups consisting of the same material 9.

In the embodiments described in the examples 1, 2 and 3, it is also possible to use as a material 9, a hard material reflecting in the near infrared range and conductive at the surface only, such as a conductive glass or a conductive ceramic.

EXAMPLE 4

Another exemplifying method of manufacture of a master disk according to the invention is diagrammatically illustrated in FIG. 3.

This method consists in depositing upon a glass support or backing 1 a layer 2 of a photosensitive substance. This glass support should preferably be a disk with a thickness of about 1.2 mm which is the standard thickness of a compact disk and should have a diameter permitting on the one hand the reading in the conventional readers of optical disks and on the other hand permitting the use of a simple process of galvanoplasty. For grounds of standardization of machines, this diameter should preferably lie between about 150 mm and about 200 mm.

This support could also consist of a tempered and/or de-alkalinized glass or of aluminum.

In a first step noted (a) in FIG. 3, the information to be duplicated is recorded onto this support as a latent image created by a light beam 3 modulated in accordance with the signal to be encoded, this light beam 3 preferably being a laser beam.

As illustrated at the step denoted (b) in FIG. 3, the glass support 1 comprises insolated zones 4 of photosensitive resin and non insolated zones 5 of photosensitive resin.

The step (c) is a step of removal of the insolated zones of resin through chemical dissolution or by any other suitable process.

At this stage is obtained the glass support 1 comprising a succession of microcups 6 at its surface.

During the following step denoted (d), there is performed the transfer of the information to be recorded into the zones 7 of the glass support by a chemical engraving process or by a process of engraving with a reactive plasma preferably by a method of engraving with a reactive plasma of argon ions and of fluorine ions, the fluorine ions being obtained by the use of gaseous trifluoromethane.

The residual resin is then removed preferably with an oxygen plasma and there is obtained the desired master disk consisting of the glass support 1 shown at (e) in FIG. 3 and comprising at its surface a succession of microcups the depth of which corresponds to the depth of the engraving previously carried out.

This succession of microcups is then covered with a layer of the material 9. The material 9 is deposited preferably through reactive cathodic spraying with a magnetron. The gases used in the case of a deposit of titanium nitride are argon required for bombarding the titanium target and nitrogen necessary to the formation of the nitride. A very accurate control of the partial pressure of the gases within the chamber is necessary to obtain a good stoichiometry.

The deposited thickness should lie between about 500 Å and 1,400 Å. It should preferably be equal to 1,100 Å.

The master disk thus obtained shown at (f) consists of the glass support 1 carrying at its surface a succession of microcups 8 the surface of which consists of the material 9.

The die 10 shown at (g) is obtained from this master disk through a step of galvanoplasty.

As in the examples 1, 2 and 3 referred to hereinabove, the master disk will allow the manufacture of a die through a step of galvanoplasty without requiring any specific preparation. It could be read out: by conventional disk readers and on account thereof it could be tested in adapted compact disk testers. In view of this very long operating life, it could thus be used as an archive or storage of information or for the future provision of new dies intended for the pressing of optical disks. Moreover it is possible to easily store it owing to its size.

An important interesting feature of the master disks according to the invention is that during the step of manufacture of the die, there is no tearing away or separation of the layer of hard and conductive material, reflecting in the near infrared range, from the master disk during the separation of the disk from the manufactured die, thereby permitting to be dispensed with depositing again a new conductive layer during the subsequent manufacture of new dies.

Owing to this preservation of the integrity of the master disks according to the invention, the information they contain are neither deteriorated nor modified.

The invention is of course not at all limited to the embodiments described and illustrated which have been given by way of examples only.

Thus the support or backing, if it does not consist of the same material as the microcups, could consist of any other material than glass and aluminum cited hereinabove on condition that it permits the obtainment of the desired surface and provides the adherence of the hard and conductive material 9 reflecting in the near infrared range.

Likewise any other hard and conductive material 9 reflecting in the near infrared range and different from those cited here could be used.

Thus the invention comprises all the technical equivalents of the means described as well as their combinations if the latter are carried out according to its gist and within the scope of the appended claims.

What is claimed is:

1. A master disk for making a die for pressing optical discs, consisting of
    a support made from a material selected from the group consisting of aluminum and glass and having an outer planar surface, and
    a layer of hard, conductive and reflecting in the near infrared range material coated directly onto said outer planar surface of said support and adhering thereto,
    said layer of hard, conductive and reflecting in the near infrared range material having a succession of microcups representative of information to be duplicated etched therein to thereby form the master disk, the master disk being structured and arranged to produce a plurality of identical dies including the information to be duplicated, each of the dies being capable of pressing a plurality of optical disks.

2. A master disk according to claim 1, wherein said hard, conductive and reflecting in the near infrared range material is selected from the group consisting of zirconium nitride, hafnium nitride, titanium nitride, zirconium carbonitride, hafnium carbonitride and titanium carbonitride.

3. A master disk according to claim 1, wherein said hard, conductive and reflecting in the near infrared range material is titanium nitride.

4. A master disk according to claim 1, wherein said support is made from glass which is tempered.

5. A master disk according to claim 1, wherein said support is made from glass which is de-alkalinized.

6. A master disk as claimed in claim 1, wherein said layer coated onto said outer planar surface of said support has a planar lower surface adjoining said outer planar surface of said support, said microcups being etched into an upper surface of said layer.

7. A master disk for making a die for pressing optical discs consisting of
    a support made from a material selected from the group consisting of aluminum and glass and having an outer planar surface, and
    a layer of a material selected from the group consisting of zirconium nitride, hafnium nitride, titanium nitride, zirconium carbonitride, hafnium carbonitride and titanium carbonitride, coated directly onto said outer planar surface of said support and adhering thereto,
    said layer having a succession of microcups representative of information to be duplicated etched therein to thereby form the master disk, the master disk being structured and arranged to produce a plurality of identical dies including the information to be duplicated, each of the dies being capable of pressing a plurality of optical disks.

8. A master disk according to claim 7, wherein said layer coated onto said support and adhering thereto is titanium nitride.

9. A master disk according to claim 8, wherein said support is made from glass.

10. A master disk according to claim 8, wherein said support is made from aluminum.

11. A master disk as claimed in claim 7, wherein said layer coated onto said outer planar surface of said support has a planar lower surface adjoining said outer planar surface of said support, said microcups being etched into an upper surface of said layer.

12. A master disk for making a die for pressing optical discs consisting of
    a support made of glass and having an outer planar surface, and
    a layer of titanium nitride coated directly onto said outer planar surface of said support and adhering thereto, said layer of titanium nitride having a succession of microcups representative of information to be duplicated being etched therein to thereby form the master disk, the master disk being structured and arranged to produce a plurality of identical dies including the information to be duplicated, each of the dies being capable of pressing a plurality of optical disks.

13. A master disk as claimed in claim 12, wherein said layer of titanium nitride coated onto said outer planar surface of said support has a planar lower surface adjoining said outer planar surface of said support, said microcups being etched into an upper surface of said layer.

14. A master disk for making a die for pressing optical discs consisting of
    a support made of aluminum and having an outer planar surface, and
    a layer of titanium nitride coated directly onto said outer planar surface of said support and adhering thereto, said layer of titanium nitride having a succession of microcups representative of information to be duplicated being etched therein to thereby form the master disk, the master disk being structured and arranged to produce a plurality of identical dies including the information to be duplicated, each of the dies being capable of pressing a plurality of optical disks.

15. A master disk as claimed in claim 14, wherein said layer of titanium nitride coated onto said outer planar surface of said support has a planar lower surface adjoining said outer planar surface of said support, said microcups being etched into an upper surface of said layer.

16. In a master disk for making a die for pressing optical discs consisting of a support made of glass and having an outer planar surface, the improvements consisting of:

a layer of titanium nitride being coated directly onto said outer planar surface of said support and adhering thereto, said layer of titanium nitride having an outer planar surface, a layer of photosensitive resin being coated directly onto said outer planar surface of said layer of titanium nitride and adhering thereto, and a outer surface of said layer of titanium nitride through said layer of photosensitive resin having a succession of microcups representative of the information to be duplicated etched therein.

17. In a master disc for making a die for pressing optical discs consisting of a support made of aluminum and having an outer planar surface, the improvements consisting of:

a layer of titanium nitride being coated directly on said planar outer surface of said support and adhering thereto, said layer of titanium nitride having an outer planar surface, a layer of photosensitive resin being coated directly onto said outer planar surface of said layer of titanium nitride and adhering thereto, and said outer planar surface of said layer of titanium nitride through said layer of photosensitive resin having a succession of microcups representative of the information to be duplicated etched therein.

* * * * *

UNITED STATES PATENT AND TRADEMARK OFFICE
CERTIFICATE OF CORRECTION

Page 1 of 2

PATENT NO. : 5,770,238
DATED : June 23, 1998
INVENTOR(S) : Jean LEDIEU and Jean-Francois DUFRESNE It is certified that error appears in the above-identified patent and that said Letters Patent are hereby corrected as shown below:

Column 3, line 1: Change "attack" (both occurrences) to --etching--.

Column 4, line 9: Change "FIG. 1" to --FIGS. 1a-1f-- and change "noted (a)" to --shown as FIG. 1a--;
line 37: Change "noted (b) on FIG. 1" to --shown as FIG. 1b--;
line 41: Change "(c)" to --shown as FIG. 1c--;
line 46: Change "noted (d)" to --shown as FIG. 1d--;
line 54: Change "at (e) to --as FIG. 1e--; and
line 58: Change "at (f)" to --as FIG. 1f--.

Column 5, line 29: Change "FIG. 2" to --FIGS. 2a-2f--;
line 34: Change "noted (a) in FIG. 2" to --shown as FIG. 2a--;
line 42: Change "noted (b) on FIG. 2" to --shown as FIG. 2b--;
line 46: Change "noted (c) in FIG. 2" to --shown as FIG. 2c--;
line 50: Change "noted (d) in FIG. 2" to --shown as FIG. 2d--; and
line 58: Change "noted (e) in FIG. 2" to --shown as FIG. 2e--.

Column 6, line 5: Change "FIG. 3" to --FIGS. 3a-3g--;
line 18: Change "noted (a) in FIG. 3" to --shown as FIG. 3a--;
line 23: Change "denoted (b) in FIG. 3" to --shown as FIG. 3b--;
line 26: Change "(c)" to --shown as FIG. 3c--;
line 31: Change "denoted (d)" to --shown as FIG. 3d--;
line 40: Change "at (e) in FIG. 3" to --as FIG. 3e--;

UNITED STATES PATENT AND TRADEMARK OFFICE
CERTIFICATE OF CORRECTION

PATENT NO. : 5,770,238
DATED : June 23, 1998
INVENTOR(S) : Jean LEDIEU and Jean-Francois DUFRESNE It is certified that error appears in the above-identified patent and that said Letters Patent is hereby corrected as shown below:

line 54: Change "at (f)" to --as FIG. 3f--; and
line 57: Change "at (g)" to --FIG. 3g--.

Signed and Sealed this

Twenty-third Day of March, 1999

Attest:

Q. TODD DICKINSON

Attesting Officer

Acting Commissioner of Patents and Trademarks